United States Patent
Ting et al.

(10) Patent No.: US 12,406,123 B2
(45) Date of Patent: Sep. 2, 2025

(54) SYSTEM AND METHOD FOR ESL MODELING OF MACHINE LEARNING

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Kai-Yuan Ting, Hsinchu (TW); Sandeep Kumar Goel, Hsinchu (TW); Tze-Chiang Huang, Hsichu (TW); Yun-Han Lee, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

(*) Notice: Subject to any disclaimer, the term of this patent is extended or adjusted under 35 U.S.C. 154(b) by 0 days.

(21) Appl. No.: 18/745,089

(22) Filed: Jun. 17, 2024

(65) Prior Publication Data

US 2024/0338506 A1    Oct. 10, 2024

Related U.S. Application Data

(60) Division of application No. 17/115,407, filed on Dec. 8, 2020, now Pat. No. 12,014,130, which is a
(Continued)

(30) Foreign Application Priority Data

May 20, 2019   (CN) .......................... 201910417773.2

(51) Int. Cl.
*G06F 30/39* (2020.01)
*G06N 20/00* (2019.01)

(52) U.S. Cl.
CPC ............. *G06F 30/39* (2020.01); *G06N 20/00* (2019.01)

(58) Field of Classification Search
USPC ......................................................... 716/110
See application file for complete search history.

(56) References Cited

U.S. PATENT DOCUMENTS

| 8,719,742 B2 * | 5/2014 | Veller .................... G06F 30/33 716/106 |
| 9,021,409 B2 * | 4/2015 | Vasudevan .......... G06F 30/3323 716/108 |

(Continued)

FOREIGN PATENT DOCUMENTS

| TW | I322365 | 3/2010 |
| TW | 201835795 | 10/2018 |

OTHER PUBLICATIONS

Office Action dated Sep. 2, 2021 from corresponding case No. TW 11020859350 (pp. 1-4).

*Primary Examiner* — Mohammed Alam
(74) *Attorney, Agent, or Firm* — Hauptman Ham, LLP

(57) ABSTRACT

A non-transitory computer-readable storage medium is encoded with a set of instructions for designing a semiconductor device using electronic system level (ESL) modeling for machine learning applications that, when executed by at least one processor, cause the at least one processor to: retrieve a source code operable to execute a plurality of operations of a machine learning algorithm; classify a first group of the plurality of operations as slow group operations and classify a second group of the plurality of operations as fast group operations, based on a time required to complete each operation; define a neural network operable to execute the slow group operations; define a trained neural network configuration including a plurality of interconnected neurons operable to execute the slow group operations; and
(Continued)

generate an ESL platform for evaluating a design of a semiconductor device based on the trained neural network configuration.

20 Claims, 10 Drawing Sheets

Related U.S. Application Data continuation of application No. 16/582,603, filed on Sep. 25, 2019, now Pat. No. 10,867,098.

(56) References Cited

U.S. PATENT DOCUMENTS

| | | | |
|---|---|---|---|
| 9,348,742 B1 | 5/2016 | Brezinski | |
| 9,600,779 B2 | 3/2017 | Hoover et al. | |
| 2015/0286766 A1* | 10/2015 | Singh | G06F 30/392 716/121 |
| 2017/0344909 A1 | 11/2017 | Kurokawa et al. | |
| 2018/0005134 A1* | 1/2018 | Kish | G06N 3/084 |
| 2019/0332952 A1* | 10/2019 | Nonaka | G06N 5/04 |
| 2020/0082051 A1* | 3/2020 | Kwon | G06N 3/045 |
| 2020/0104459 A1* | 4/2020 | Tong | G06N 7/023 |
| 2020/0372124 A1* | 11/2020 | Ting | G06F 30/33 |

\* cited by examiner

SYSTEM AND METHOD FOR ESL MODELING OF MACHINE LEARNING

PRIORITY CLAIM

The present application is a divisional of U.S. patent application Ser. No. 17/115,407, filed Dec. 8, 2020, and issued as U.S. Pat. No. 12,014,130 on Jun. 18, 2024, which is a continuation of U.S. patent application Ser. No. 16/582,603, filed Sep. 25, 2019, and issued as U.S. Pat. No. 10,867,098 on Dec. 15, 2020, which claims priority to China Pat. Appl. No. 201910417773.2, filed May 20, 2019, the contents of which are incorporated herein by reference, in their entireties.

BACKGROUND

Electronic system level (ESL) design and verification methodology focuses on utilizing appropriate abstractions for increasing comprehension regarding a proposed system and for improving the probability of successfully implementing the desired functionality while meeting power, performance and area (PPA) targets.

This ESL methodology is evolving as a set of complementary tools that allows for an integrated process through system design, verification, and debugging to the hardware and software utilized in implementing the system. In some instances, the resulting system is a system on chip (SOC or SoC), a system-on-field programmable gate array (SOFPGA or SoFPGA), a system-on-board (SOB or SoB), or a multi-board system.

Machine learning (ML) systems providing artificial intelligence (AI) features are expected to be useful in a number of applications including, for example, automotive systems, high performance computing, and/or the Internet Of Things (IoT or IoT), also referred to as the Internet Of Everything (IOE or IoE). Performing a high-level synthesis of such machine learning systems typically includes converting the code for an initial algorithm into a more abstract representation. For example, algorithm code provided in an interpreted high-level programming language, such as C/C++ or Python, can be converted into a Hardware Description Language (HDL), such as Very High Speed Integrated Circuit (VHSIC) Hardware Description Language (VHDL) or Verilog, to create a representation at a Register-Transfer Level (RTL) of abstraction.

BRIEF DESCRIPTION OF THE DRAWINGS

The present disclosure is best understood from the following detailed description when read in conjunction with the accompanying drawings. Like reference numerals denote like features throughout specification and drawings.

DETAILED DESCRIPTION

Figure 1:
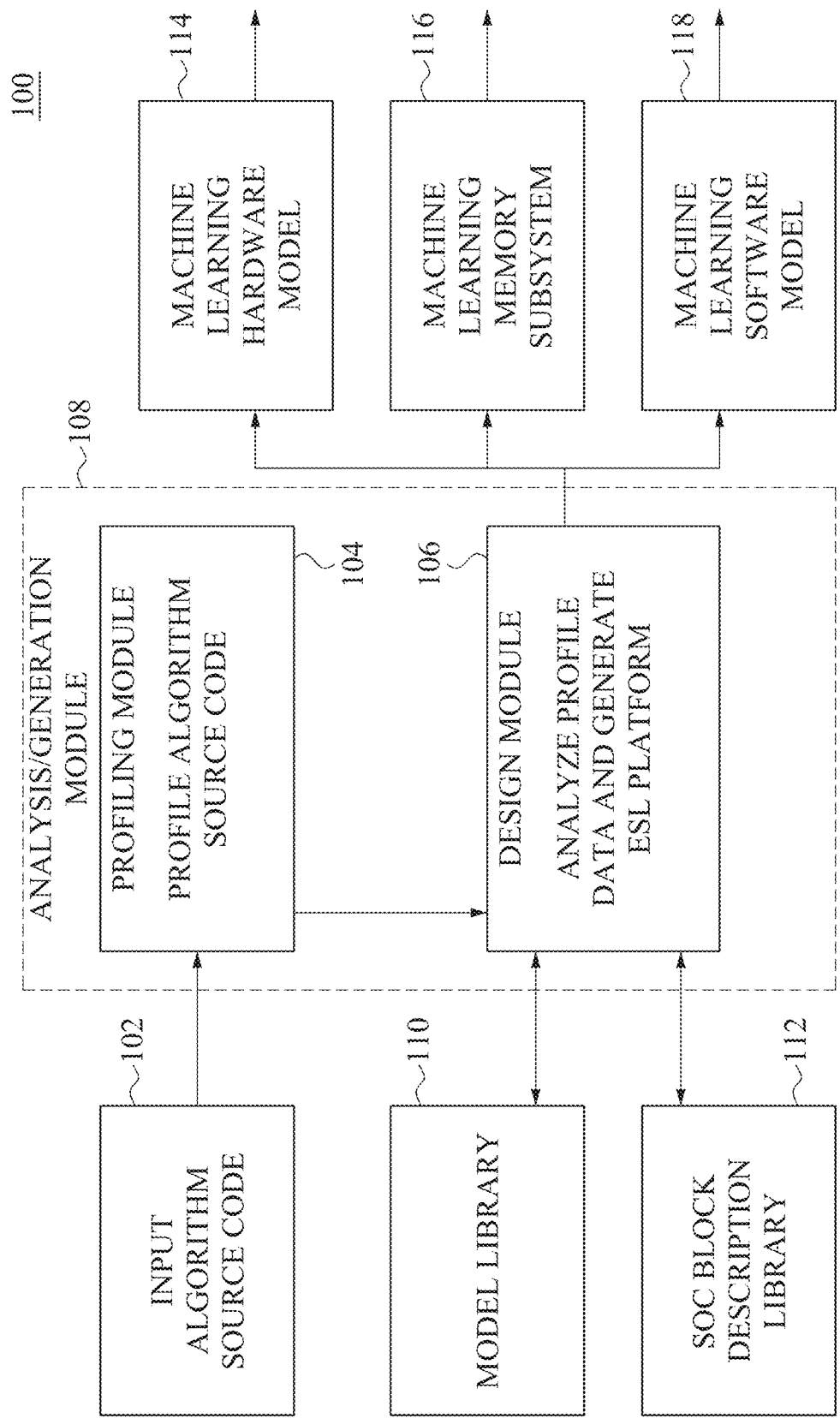
FIG. 1 is a flowchart of initial interactions between components of a system in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Modelling machine learning systems providing artificial intelligence functionality typically select one or more initial algorithms written in an interpreted high-level programming language including, for example, Python, Java, C, C++, JavaScript and the like. The algorithms in the programming language (hereinafter referred to as code) corresponding to the selected algorithm(s) is then translated into a hardware description language (HDL) including, for example, Verilog (IEEE 1364), to simulate hardware usable to implement the modelling machine learning system, typically at the register-transfer level (RTL) of abstraction.

Executing code-based simulations at the RTL, however, for more complex systems, results in longer simulation and regression times. Depending on the complexity of the simulation, the processing speeds achieved during the simulation are unable to match or even approach the speed achievable by a corresponding semiconductor device. Working at the RTL also limits a designer's flexibility for partitioning hardware (HW) and software (SW) elements of the design, in some instances. The increased processing and limited configuration flexibility result in increasing demands on both the processing time and memory resources in order to simulate the learning/training and testing processes of the design.

In some embodiments of the system and method, an appropriate algorithm is selected for allocating various software-based and hardware-based simulation tools in order to improve simulation speed and efficiency. Suitable algorithms may include, for example:

- a Bayes classifier (or naïve Bayes classifier) algorithm in which class labels are assigned to problem instances, represented as vectors of feature values, with each feature value being considered independent from all other feature values;
- a nearest neighbor algorithm that takes a collection of points as an input and creates a hierarchy of point clusters by repeatedly merging smaller point clusters to form larger point clusters;
- a decision tree algorithm that predicts the value of a target variable based on several input variables;
- a linear regression algorithm that models a relationship between a dependent variable (y) and at least one independent variable (x) based on a known series of (x,y) pairs for predicting a value ($y_n$) based on a new value of ($x_n$);
- a feed forward algorithm in which the weights applied to neurons including a neuron network (or neuron network) are used in iteratively computing gradients for each layer;
- a backpropagation algorithm for calculating gradients used in adjusting the weights applied to the neurons in a neuron network in order to achieve a desired result;
- a Gauss-Newton algorithm for solving non-linear least squares problems; and/or.
- another algorithm suitable for achieving the desired machine learning system functionality.

Although multilayer neuron networks (NN) are able to use a variety of learning techniques, backpropagation is of particular utility. During a training phase of the NN, the output values obtained using a training data set are compared with correct answers and used to compute the values of a corresponding error-function. This error-function is then fed back through the NN and used in adjusting the weights applied to each connection in order to reduce the value of the error function and improve the accuracy of the NN. After repeating the backpropagation process over a sufficiently large number of training cycles, the NN under training tends to converge on a set of weights that produce an error within predetermined tolerance limits and the training is deemed complete. Once trained, the NN is usable for analyzing test data sets.

FIG. 1 is a flowchart of interactions between components of a system in accordance with some embodiments. Source code corresponding to a selected algorithm is provided in module 102. The source code is fed into a profiling module 104 that analyzes the functions inherent in the source code and allows the various functions to be profiled or categorized. The results of the source code profiling operation are then fed to a design module 106 where the results are used to generate an ESL platform. The profiling module 104 and the design module 106 may be grouped together as an analysis/generation module 108. The design module 106 accesses one or more model libraries 110 and/or SOC block description libraries 112 in configuring the resulting ESL platform design. The referenced model libraries and SOC block description libraries include collections of standard cells and/or blocks, also referred to as macros, cores, IP, or virtual components, that have been previously designed and verified for use in connection with full custom design, automatic layout generation, physical design, logic synthesis, and/or CAD tools. Some collections of cells and blocks may be specific to a particular process and/or the number of levels of metallization available for customization.

The output of the analysis/generation module 108 includes a machine learning hardware model 114, a machine learning memory subsystem model 116, and a machine learning software model 118. Machine learning software model 118 is configured to run on a device representing the combination of the machine learning hardware model 114 and the machine learning memory subsystem model 116.

Figure 2:
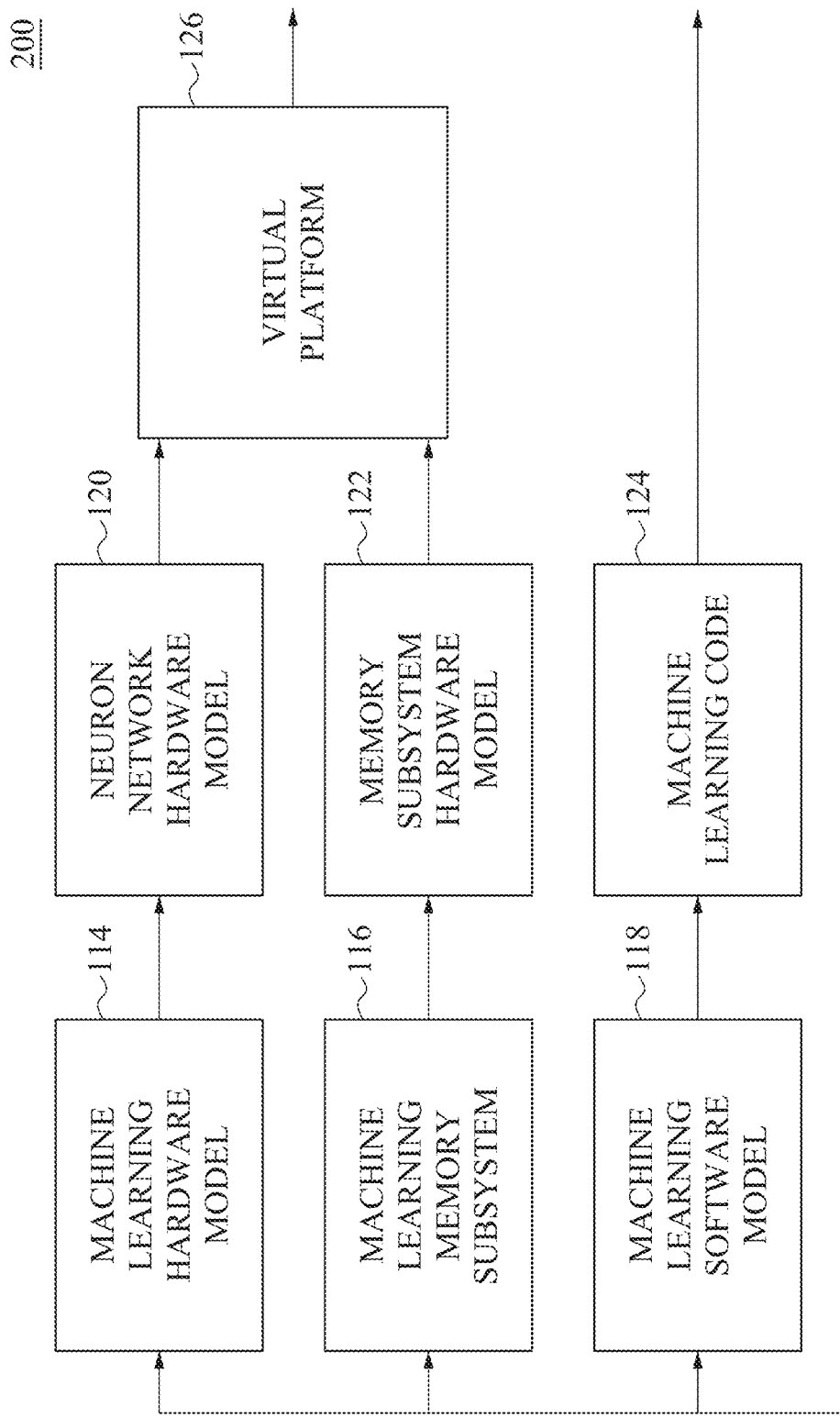
FIG. 2 is a flowchart of interactions between components of a system subsequent to the interactions of FIG. 1 in accordance with some embodiments.

FIG. 2 is a flowchart of interactions between components of a system in accordance with some embodiments in which machine learning hardware model 114 is, in turn, configured as a neuron network hardware model 120. Similarly, the machine learning memory subsystem model 116 is configured as a memory subsystem hardware model 122 capable of executing machine learning code 124 derived from the machine learning software model 118. The neuron network hardware model 120 and the memory subsystem hardware model 122 are then combined to create a virtual platform 126 for emulating the various functional components that would be found on a corresponding physical semiconductor device. In some embodiments, some or all of the structural information, operations, and/or functions provided by or generated in the machine learning hardware model 114, the neuron network hardware model 120, the machine learning memory subsystem model 116, the memory subsystem hardware model 122, the machine learning software model 118, and/or the machine learning code 124 can be incorporated into the design module 106. In such embodiments, the design module 106 is used to generate the virtual platform 126.

Figure 3:
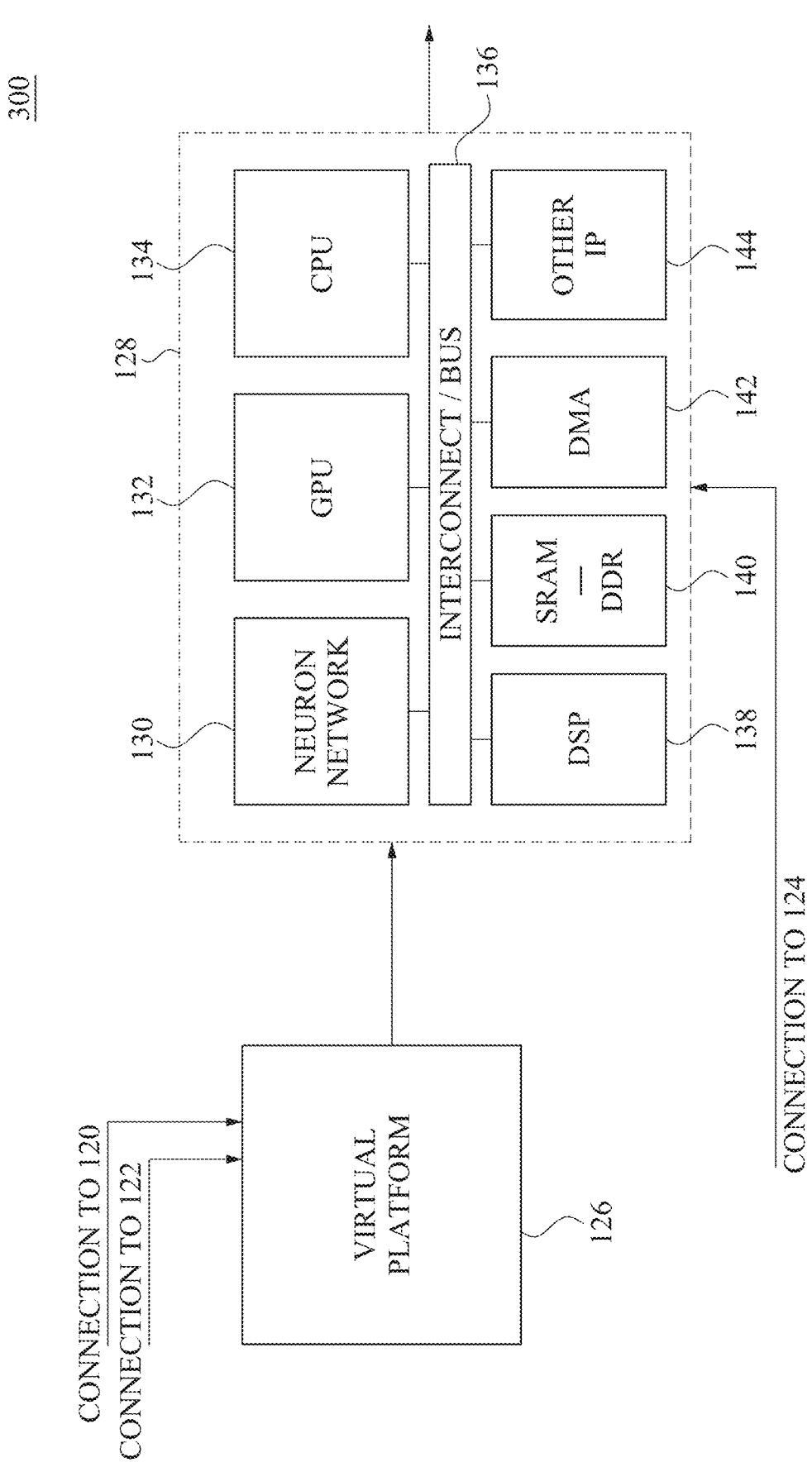
FIG. 3 is a flowchart of interactions between components of a system subsequent to the interactions of FIG. 2 in accordance with some embodiments.

FIG. 3 is a flowchart of interactions between components of a system in accordance with some embodiments in which the virtual platform 126 includes a number of discrete elements as shown in device 128. In this embodiment, the discrete elements include, for example, a neuron network 130, a graphics processing unit (GPU) 132, a central processing unit (CPU) 134, interconnect or bus 136 for providing electrical connection between the various elements, a digital signal processor (DSP) 138, a static random-access memory (SRAM)/double data rate memory (DDR) 140, a direct access memory (DMA) 142, and/or other input/output devices 144. The various discrete elements found in device 128 can be expressed as a computer simulation of the device, an emulation of an actual device including emulation of one or more of the functional units, or as a functional semiconductor-based device such as a system on chip (SOC).

In some embodiments, the SOC combines a variety of distinct functional semiconductor devices or components that cooperate to define an electronic system on a single substrate. In some embodiments, the SOC contains semiconductor devices or elements designed for providing a desired combination of digital, analog, mixed-signal, and/or radio-frequency (RF) functions for addressing a particular problem, task, or family of related problems/tasks.

In some embodiments, the SOC includes a central processing unit (microcontroller or microprocessor), with or without a code compression algorithm, integrated with one or more peripheral devices, and one or more memory devices. The one or more peripheral devices include graphical processing units (GPUs), Digital Signal Processor(s) (DSPs), and the like. The one or more memory devices include, for example, electrically erasable programmable read-only memory devices (EEPROMs), flash memories, Direct Memory Access devices (DMAs) (and DMA controllers for routing data between external interfaces and SOC memory while bypassing the processor core and thereby increasing the data throughput), Read Only Memories (ROMs), Dynamic Random Access Memories (DRAMs), Static Random Access Memory (SRAMs), and the like.

Other semiconductor devices included in some embodiments include timing sources, such as oscillators, phase-locked loops, counter-timers, real-time timers, power-on reset generators and the like; external interfaces, including industry interface standards such as Universal Serial Bus (USB), Fire Wire, Ethernet, Universal Synchronous and Asynchronous Receiver-Transmitter (USART), Serial Peripheral Interface bus (SPI); analog interfaces including analog to digital converters (ADCs) and digital to analog converters (DACs); voltage regulators, power management circuits; and at least one bus and a bus controller for controlling the communications and data transfer between the various functional elements included in the SOC; and DMA controllers for routing data directly between external interfaces and memory, bypassing the processor core and thereby tending to increase the data throughput of the SOC.

In some embodiments, the SOC includes both the hardware elements, described above, and the associated software used for controlling the microcontroller, microprocessor and/or DSP cores, peripherals, and/or interfaces. The design flow for some SOC embodiments develops the hardware and software in parallel.

In some embodiments, the SOCs are developed from a pre-qualified collection of hardware or IP blocks (e.g., SOC block description library 112) configured to provide the range of functionality noted above. The hardware blocks are provided in combination with software drivers that control the operation of the various hardware blocks. In some embodiments, after the basic architecture of the SOC has been defined, additional hardware elements may be introduced with, for example, a corresponding model at the RTL of abstraction for defining the additional/modified circuit behavior. The additional and/or modified circuit behavior and the corresponding elements in combination with the original model are then combined and refined by the designer to achieve a full SOC design.

Figure 4:
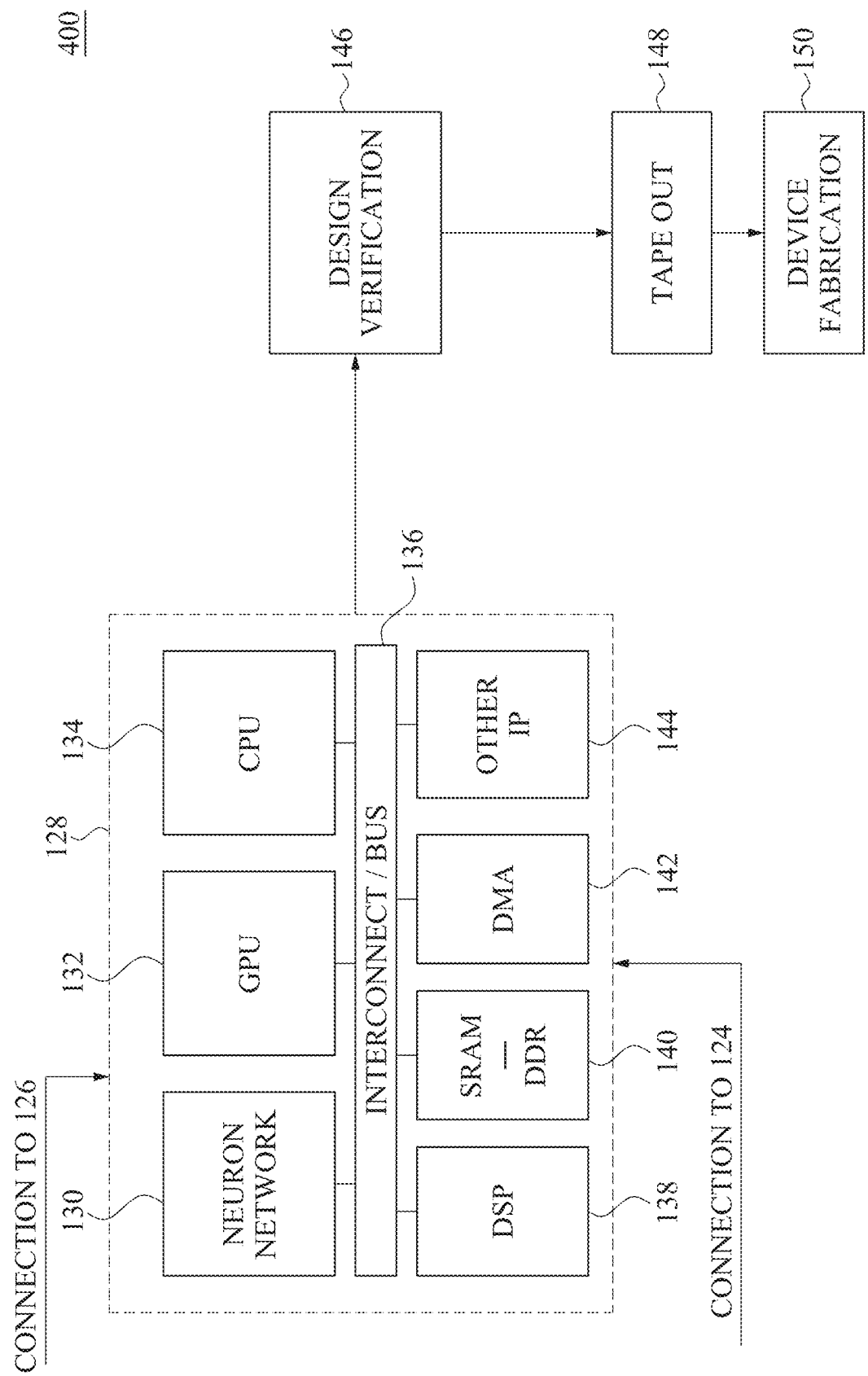
FIG. 4 is a flowchart of interactions between components of a system subsequent to the interactions of FIG. 3 in accordance with some embodiments.

FIG. 4 is a flowchart of interactions between components of a system in accordance with some embodiments in which the design of device 128 is subjected to additional functional and layout design verification 146. When the design has passed both functional verification and layout design verification, the verified design of device 128 is used in generating a tape out file 148. The generated tape out file 148 is then used in fabricating a functional semiconductor device corresponding to the design rules of a selected fabrication process. In some embodiments, if a proposed design fails any verification step, the designer conducts a failure analysis to identify and understand the issues resulting in the failure, and then modifies, amends, or corrects the failing design to address the identified issues with a revised design. Depending on the nature of the failure, in some embodiments the system provides the designer with proposed modifications, adaptations, and/or corrections for resolving or removing the failure. In some embodiments, the revised design will then be subjected to the same (or a modified) series of verification, simulation, and/or emulation processes in a renewed attempt to produce a verified design for production.

In electronic design automation (EDA) processes, functional verification involves verifying that the logic design conforms to a specification. Functional verification is a part of a design verification process, during which various non-functional aspects like timing, physical layout and power consumption are also considered. Functional verification is an increasingly complex task and, in some embodiments, consumes most of the time and effort in large electronic system design projects. The time and effort devoted to functional verification is a function of the number of possible test cases and conditions that can be applied to even relatively simple designs. For more complex designs, verifying every possible set of conditions and inputs would be extremely time consuming, so a number of approaches have been developed for providing a level of testing that satisfies error tolerances in a reduced amount of time.

In some embodiments, the EDA processes include a number of steps for verifying the functionality and layout of a particular device design. In some embodiments, the verification steps include an initial high-level synthesis (also referred to as behavioral synthesis or algorithmic synthesis) in which a high-level design description of the algorithm is converted to an RTL design abstraction. In some embodiments, the RTL design abstraction includes a discrete netlist of logic gates (logical synthesis) nominally capable of executing the algorithm. In some embodiments, the RTL design abstraction is then used in conjunction with a hardware description language (HDL) for creating high-level representations of a corresponding circuit (schematic capture or entry). The high-level representation of the circuit is then refined through a series of debugging operations and/or lower-level representations until a design for the actual layout of the functional blocks and associated wiring/interconnections is achieved.

In some embodiments, one or more of the models is utilized for simulating the device performance including, for example, a low-level transistor simulation of the anticipated behavior of a particular schematic/layout. In some embodiments, one or more of the models is utilized for simulating the digital behavior expected from a particular RTL design abstraction. In some embodiments, one or more of the models is utilized for providing a high-level simulation of the design's operation.

In some embodiments, one or more of the models is utilized for developing a particular configuration of semiconductor device hardware capable of emulating the logical function of the proposed design. In some embodiments, verification processes include equivalence checking involving an algorithmic comparison between an RTL-description and synthesized gate-netlist of the design in order to ensure functional equivalence between the two models.

In some embodiments, verification processes include one or more of static timing analysis and/or physical verification to help ensure that a particular design is capable of being manufactured under a corresponding set of design rules, that the design does not have any fatal or problematic physical defects and will meet original performance and design specifications.

In some embodiments, after the simulations and/or emulations of the design models has/have been completed successfully, the design data is used in one or more manufacturing preparation processes including, for example, mask data preparation during which the design of a corresponding series of photolithography photomasks that are used for physically manufacturing the chip according to a known set of design rules (and/or certain exceptions to such design rules). In some embodiments, resolution enhancement techniques (RET) are applied for increasing the quality of a final photomask(s) or photomask set. In some embodiments, the photolithography masks (mask set) are subjected to optical proximity correction to reduce the unwelcome effects associated with diffraction and interference effects when the mask set is utilized for producing the actual devices. The completed mask set is then available to the fabrication (FAB) group for producing the design.

Figure 5:
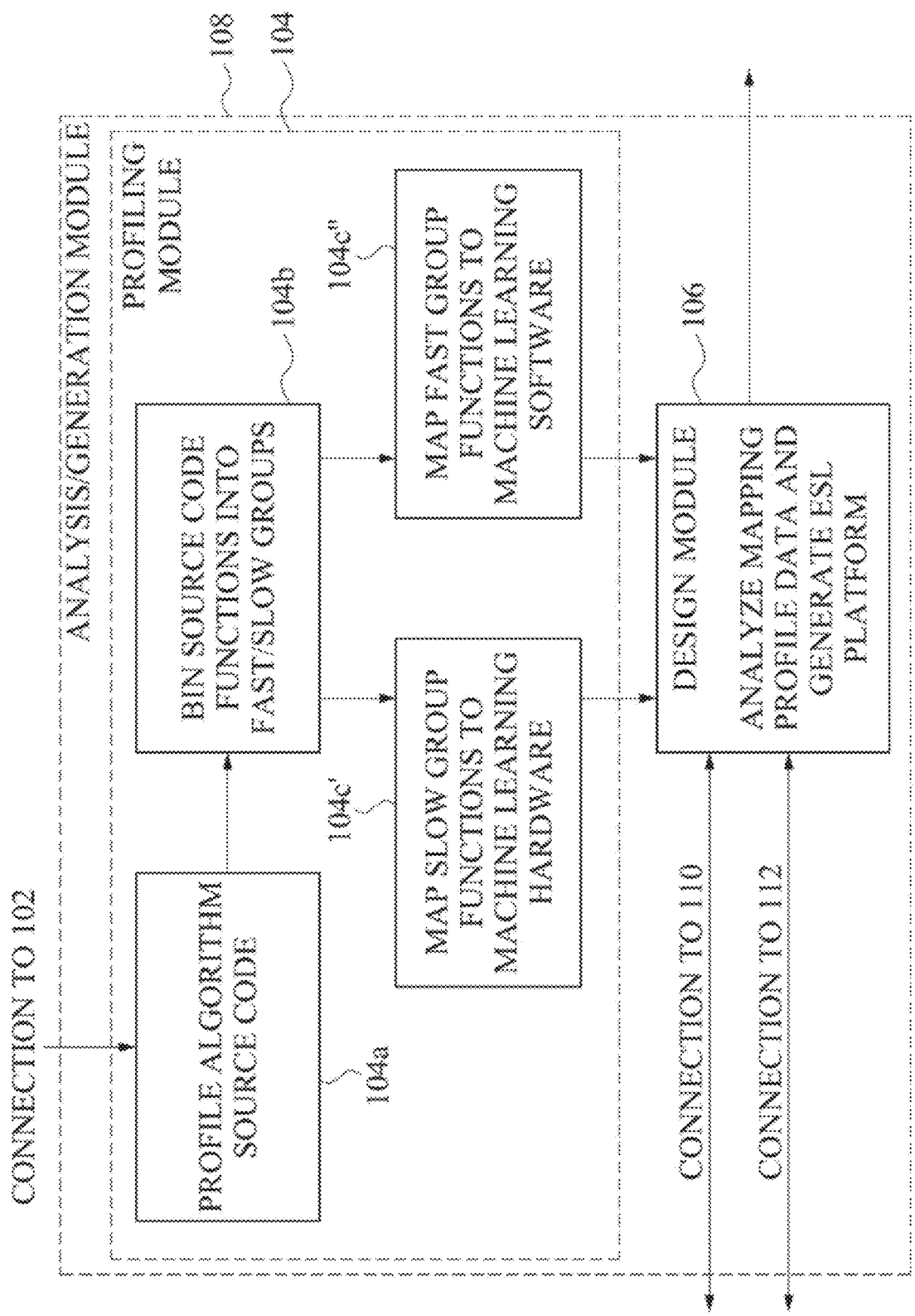
FIG. 5 is a flowchart of interactions between components within analysis/generation module 108 as shown in FIG. 1 in accordance with some embodiments.

FIG. 5 provides additional detail regarding the functions within the analysis/generation module 108 (FIG. 1). As described in reference to FIG. 1, source code from module 102 corresponding to the selected algorithm(s) is fed into the profiling module 104 where the functions executed by the source code are profiled in module 104a and categorized (or binned) in module 104b into at least fast group functions and slow group functions depending on the time required to complete the function. The fast group functions are then mapped to machine learning software in module 104c" and the slow group functions are then mapped to machine learning hardware in module 104c'. Machine learning software map and machine learning hardware map are then fed into the design module 106 where the maps are used in generating an ESL platform configured for executing both the machine learning hardware and the machine learning software.

In some algorithms, a subset of functions/sub-functions consume the majority of the total execution time. In some embodiments, the output of the profiling operation conducted in module 104a includes a report reflecting the execution time contribution of each function/sub-function to the total execution time for completing the full algorithm. The various functions/sub-functions are then able to be ranked from the fastest to the slowest based on the execution times determined in the profiling operation. For example, initialization functions/sub-functions tend to be much faster than training/learning functions/sub-functions. The distinction between the fast group functions and slow group functions is then based on the distribution of the execution time for each of the functions/sub-functions. For example:

| Initialization Functions: | |
|---|---|
| Load_Training_Set_Data ( ) | 1% |
| Loading_Test_Set_Data ( ) | 1% |
| Init ( ) | 2% |
| Init_Weights ( ) | 3% |
| Training/Learning Functions: | |
| Get_Gradient ( ) | 15% |
| Get_Costs ( ) | 20% |
| Update_Weights ( ) | 23% |
| Feed_Forward ( ) | 35% |
| TOTAL execution period | 100% |

In the above example, the listed Training/Learning Functions are projected to consume 93% of the total execution period, i.e., the slow group functions, while the listed Initialization Functions, i.e., the fast group functions, are projected to consume only 7% of the total execution period. Accordingly, setting a fast group/slow group cutoff somewhere between 5% and 15%, for example, 10%, of the total execution period would be sufficient to achieve satisfactory binning of the fast group and slow group functions. In some embodiments, differentiating between fast and slow groups is automatically determined based on user preferences. In some embodiments, a user sets a cutoff for determining fast and slow groups. In some embodiments, a recommended cutoff point for determining fast and slow groups is recommended to a user.

The process of profiling the algorithm source code and the subsequent binning of the various functions into at least fast group functions and slow group functions improves the resulting simulation, emulation, and/or prototyping by allowing the slow group functions to be executed on dedicated and faster hardware, specifically a NN provided within the device or as part of a SOC, while the fast group operations are supported by the remaining semiconductor devices and/or functional elements. In some embodiments, by dividing the algorithm's operations into fast and slow groups, the time and resources committed to both the design and verification operations of the corresponding EDA processes are improved and the combination of power, performance and area (PPA) that can be achieved for a particular design is improved.

In some embodiments, the profiling conducted in profiling module 104 utilizes virtual machine compilation software including, for example, Valgrind, for translating the algorithm code into a temporary, processor-neutral data structure referred to as an intermediate representation (IR). In some embodiments, one of a number of tools is then used to modify, analyze, or transform the intermediate representation into a target language that will be used for subsequent simulation. One tool that may be used is a call graph profiler such as Callgrind (or Calltree or Cachegrind). Callgrind analyzes the relationships between the various subroutines including the algorithm code and generating a call graph (multigraph) representing the processing time corresponding to each subroutine. In some embodiments, this Callgrind analysis data is then used for categorizing the various subroutines as being in the fast group functions and slow group functions based on the time required to complete the associated subroutine. In some embodiments, the designer sets a predetermined maximum time limit for subroutine processing time with subroutines that exceed the maximum time being designated as slow group functions and subroutines completed within the maximum time limit being designated as fast group functions. In some embodiments, the designer sets a predetermined maximum percentage that is applied to a distribution of the processing times for the evaluated subroutines with subroutines having times above the maximum percentage within the distribution being designated as slow group functions and subroutines having times within the maximum percentage limit being designated as fast group functions. In some embodiments, the designer sets a predetermined maximum percentage that is applied to a weighted distribution of the processing times for the evaluated subroutines with subroutines having times that contribute more than the maximum percentage to the total processing time for all subroutines being designated as slow group functions and subroutines that contribute less than the maximum percentage to the total processing time for all subroutines being designated as fast group functions.

Figure 6:
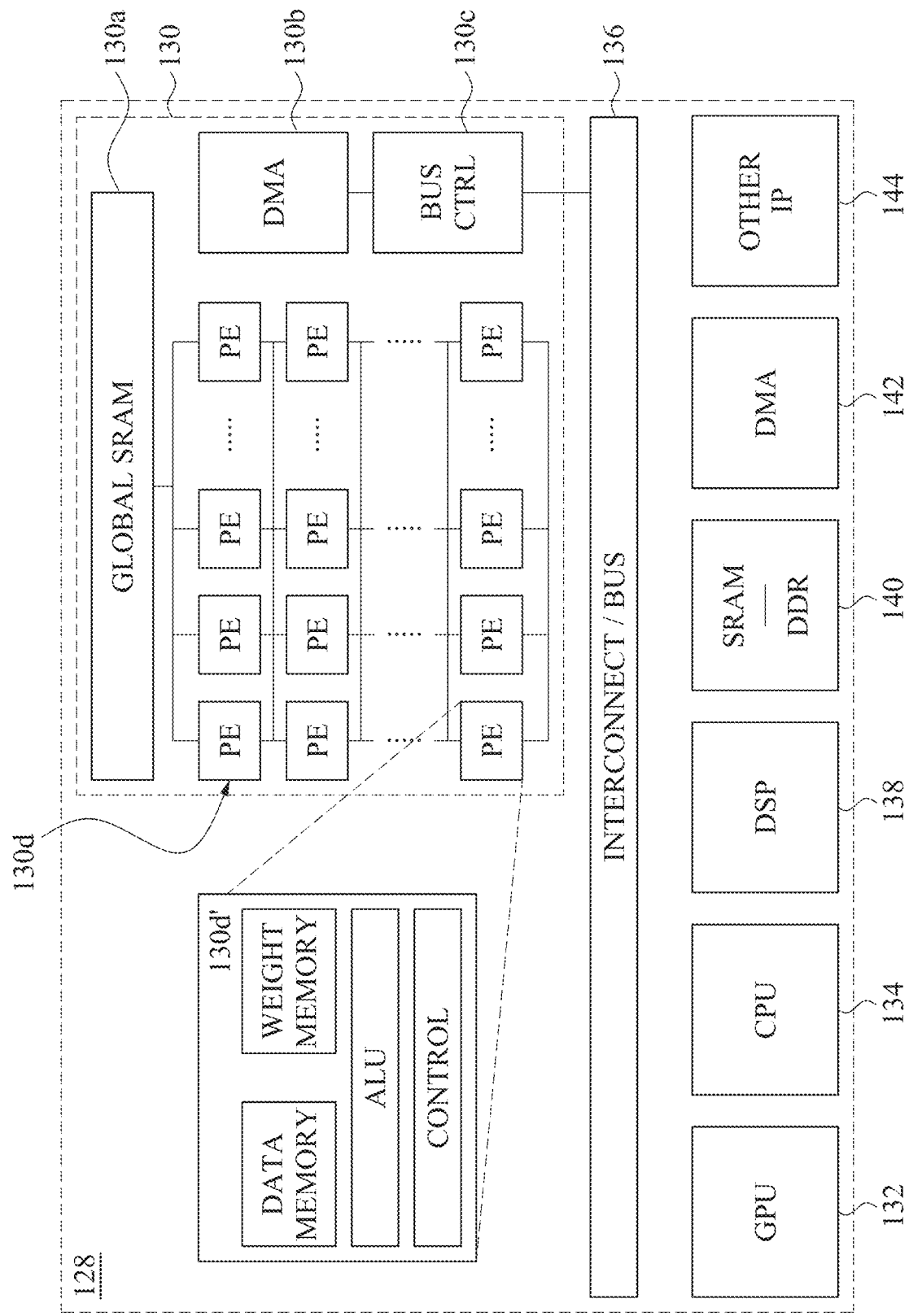
FIG. 6 is a flowchart reflecting additional detail regarding the device 128 as shown in FIG. 4 in accordance with some embodiments.

FIG. 6 provides additional detail regarding the configuration of device 128, particularly with respect to the configuration of the machine learning hardware including neuron network According to some embodiments of the method and system, the neuron network 130 further includes a global SRAM 130a, a DMA 130b, a bus controller 130c, and a plurality of interconnected processing elements (PE) 130d. According to some embodiments of the system, each PE 130d includes its own data memory, weight memory, arithmetic logic unit (ALU), and a control element.

Neuron networks (NNs) are computing systems inspired by biological neuron networks that can learn (are capable of independently improving the ability of the neuron network to achieve a correct result) to do tasks by considering a set of examples, generally without the necessity for task-specific programming. Neuron networks are based on a collection of connected units called neurons, or artificial neurons, that are used as analogs to the axons found in a mammalian brain. Connections between a pair of neurons can be configured to transmit signals to the second "downstream," or receiving, neuron and/or provide for two-way communication between the two connected neurons.

The receiving neuron processes the signal(s) received from each of the connected "upstream" neuron(s) and, in turn, transmits a signal to the "downstream" neuron(s) to which the sending neuron is connected. Each of the signals will have an associated weight or bias reflecting the significance of the particular signal in achieving the desired or target result. These weights and/or bias for each connection and/or node can be adjusted during the learning cycle(s) in order to increase or decrease the strength of the associated signal. The adjustments to the weights and/or biases are intended to improve, through a series of iterations, the overall accuracy of the neuron network.

A basic neuron network, also referred to as a neural network, includes a series of input neurons, or nodes, that are connected to at least one output node. More commonly, neuron networks include additional layers of "hidden" nodes, i.e., a layer of nodes that are not included in either the input nodes or the output node(s). Highly connected, or fully connected, neuron networks include connections between each of the nodes in a preceding layer and each of the nodes including the next layer.

For neuron networks with large numbers of nodes in one or more hidden layers, e.g., those used in analyzing high resolution images, the number of connections can quickly become unwieldy. As a result of the complexity resulting from the numerous connections, the complete hardware implementation of such highly connected neuron networks can consume a large silicon area and result in high power consumption. Accordingly, efforts are typically made to adapt the neuron network to standard hardware modules including fewer nodes and/or connections that will provide a more acceptable combination of power, performance and area (PPA) while still providing an acceptable level of accuracy.

The power/energy consumption of neuron networks is typically dominated by memory access, particularly in the case of fully-connected neuron networks. Depending on the nature of the problem being addressed and the corresponding algorithm, neuron networks in which many of the interconnections have been eliminated to produce a lightly or sparsely-connected neuron network can provide suitable performance while reducing energy consumption.

Neural networks can be arranged in a number of configurations which, in turn, provide different capabilities. A deep neuron network (DNN) is a neuron network that includes more than one hidden layer between the input and output layers and can be used to model complex non-linear relationships. The extra layers provided in DNN architectures allow for the creation of additional features from preceding layers, thereby allowing complex data to be modelled more effectively than the modelling that can be achieved using neuron network architecture having no more than one hidden layer.

Other types of neuron networks include recurrent neuron networks (RNNs), in which data can flow in any direction through the network, and convolutional deep neuron networks (CNNs) which utilize a "convolution" operator or layer and an associated step for identifying and extracting certain target elements, i.e., facial features, from the input image(s) while preserving the spatial relationship between the pixels including the target elements.

When configuring a neuron network, designers consider a number parameters including the size (both the number of layers and number of neurons per layer), the hardware on which the neuron network will be executed, the learning rate, other variables, initial biases, and initial weights. The improved processing capabilities of some newer semiconductor architectures have increased the available processing power, particularly with respect to the use of tensor processing units (TPUs) and/or graphical processing units (GPUs) for handling the complex matrix and vector computations associated with more complex neuron networks and expanded the range and complexity of neuron networks that can be modeled effectively.

In some embodiments, the number of neurons (or nodes) that a designer chooses to include in the input layer, i.e., those nodes that receive an input from an external source, will correspond to the problem that the neuron network is being designed to address. In some embodiments, other factors, such as the number of pixels being evaluated and/or the number of processing units available in an ASIC or other semiconductor device that can be designated as individual neurons, are considered in determining the number of neurons included in the input layer.

When considering the inclusion of hidden layers, i.e., those nodes that receive an input from an input layer node or another hidden layer node, in structuring a highly (or densely) connected neuron network, the number of hidden layers to include and, for each of the layers, is selected based on how many individual neurons (or nodes) will be included. While simple neuron networks are used for addressing problems that include few inputs, few outputs, and strong correspondence between a given set of inputs and an associated output, problems that generate complex datasets, such as analyzing sequential views, image recognition, and/or computer vision, generally include neuron networks having at least one hidden layer.

In some embodiments, neuron networks having a single hidden layer are used for approximating functions that include the continuous mapping of data from a first finite space to a second finite space. In some embodiments, neuron networks having two hidden layers are used to create arbitrary decision boundaries using rational activation functions for approximating smooth mapping functions to a desired degree of accuracy. In some embodiments, neuron networks having more than two hidden layers are configured for learning complex representations for one or more subsequent layers.

After the number of hidden layers has been determined, the number of neurons included in each of the input, hidden, and output layers is selected. Failing to include a sufficient number of neurons in the hidden layer(s) tends to lead to underfitting. In an underfitted neuron network configuration, the hidden layer(s) does not contain the number of neurons sufficient for processing the input from a complicated data set. As a result, such an underfitted neuron network, even after training, is often unable to achieve the level of accuracy within an acceptable error tolerance.

Conversely, including too many neurons in the hidden layer(s) of a neuron network tends to lead to overfitting. In an overfitted neuron network configuration, the hidden layer(s) contains so many neurons that the limited amount of information contained in the training data set(s) is not sufficient to train all of the neurons in the hidden layers. If the size of the training data set(s) is increased to provide adequate training for an overfitted neuron network, the time and resources necessary to train the neuron network will increase accordingly.

In order to reduce the likelihood of underfitting or overfitting a neuron network, general guidelines including, in some embodiments, limiting the total number of hidden neurons in the hidden layer(s) to a number less than the number of neurons in the input layer but more than the number of neurons in the output layer, are utilized. In some embodiments, guidelines limit the total number of hidden neurons in the hidden layer(s) to a fraction of the number of neurons in the input layer (e.g., ½, ⅔, ⅗, or ¾) added to the number of neurons in the output layer. In some embodiments, the total number of hidden neurons in the hidden layer(s) is limited to a straight multiple of the number of neurons in the input layer (multiples, e.g., 1.25, 1.5, or 2).

In some embodiments, the number of neurons (or nodes) in an output layer will depend on the various solutions or results that the neuron network is being designed to provide. In some embodiments, other factors are considered, such as the number of expected output values (e.g., the digits 0-9 for handwritten numbers, the number of objects or things potentially subject to identification in a photograph, or personal identification information correlated to facial recognition or iris scans) pixels being evaluated and/or the number of processing units available in an application specific integrated circuit (ASIC) or other semiconductor device that are designated as individual neurons.

Figure 7:
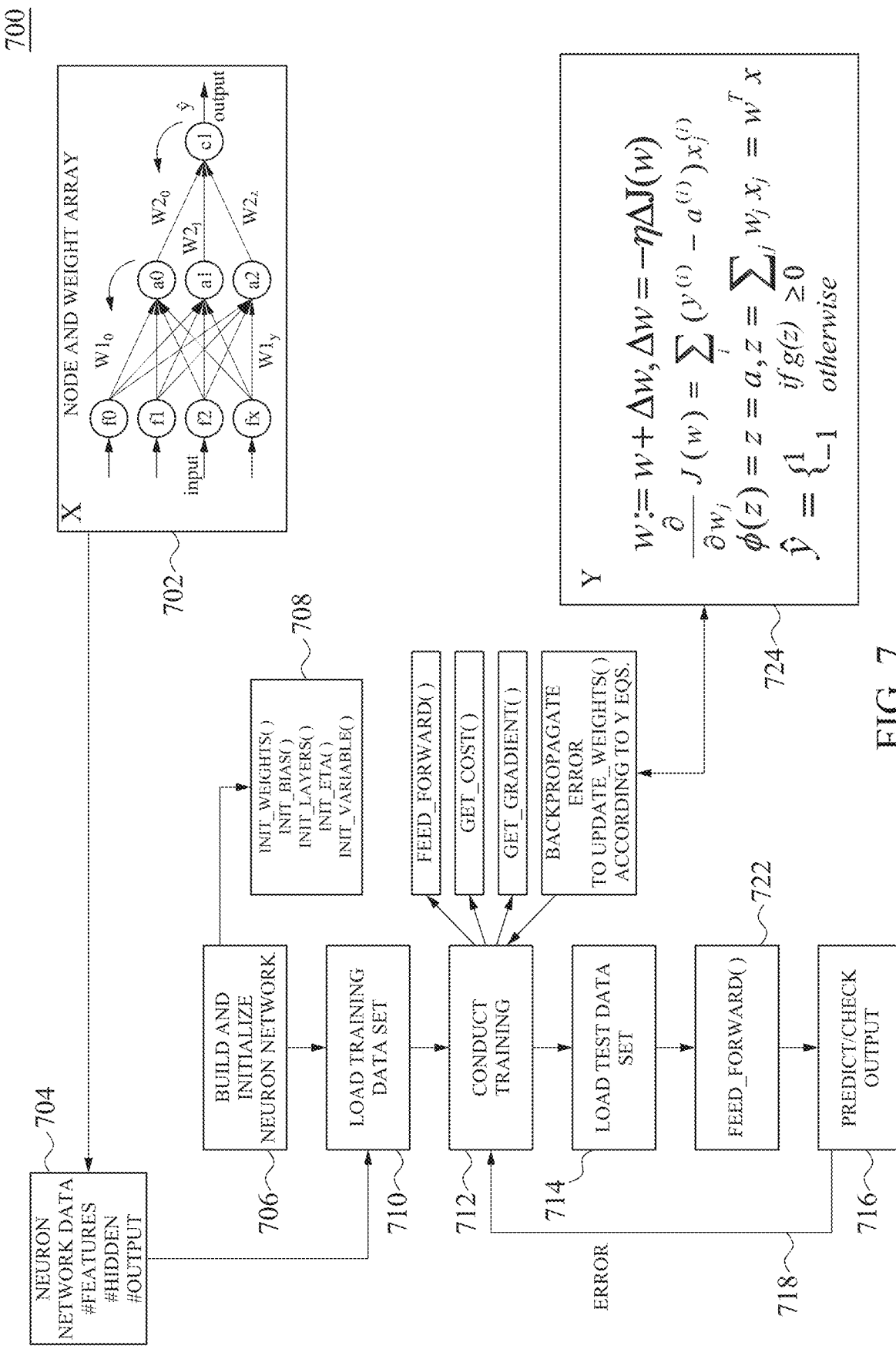
FIG. 7 is a flow chart reflecting the general operation of a system and method 700 for developing an ESL model for machine learning applications in accordance with some embodiments.

FIG. 7 is a flowchart of a method 700 in which a neuron network is utilized in a machine learning application according to some embodiments. Method 700 includes a 3-layer neuron network 702 which includes an input layer of nodes (or features) including f0, f1, f2 . . . fx; a hidden layer of nodes a0, a1 . . . ay; and an output layer including the single node c1 generating signal ŷ. In some embodiments, method 700 includes a neuron network 702 having more than 3 layers. The neuron network 702 also includes a number of interconnections between the layers of nodes including interconnections w10 . . . w1y between the input layer nodes and the hidden layer nodes and interconnections w20 . . . w2z between the hidden layer nodes and the output layer node(s). Each of these interconnections will be characterized by a weight w that can be adjusted based on the neuron network performance achieved with one or more training data sets.

The effort to optimize the response achieved by a machine learning application relies on the response from an evaluation function, often referred to as the cost function, which, in some embodiments, is internal to the algorithm selected by the designer. Depending on the context, other terms including loss function, objective function, scoring function, or error function may be used instead of the cost function. Regardless of the name, each of these evaluation functions is used for providing a measurement of how well the machine learning algorithm maps inputs to the target outcomes for a given data set and application.

A cost function works by comparing the algorithm prediction(s) against the expected outcome(s) associated with a particular set of input, e.g., a training data set. The cost function uses the degree of difference between a prediction and the expected value to determine the error level of the algorithm. In some embodiments, a particular cost function is associated with the algorithm. In other embodiments, the user chooses or otherwise defines the cost function based on the problem to be solved, the level of accuracy desired, and/or the available time and computing resources devoted to the problem.

Even when selecting algorithms that do not permit selection or customization of the associated cost function(s), in some embodiments the user influences the cost function optimization process by selecting related parameters and/or input features in order to adjust the result based on the problem being addressed.

In some embodiments, a training session is conducted during which the cost function is used to guide the process of updating the weights within the neuron network by identifying those changes to the weight parameters that improve the prediction accuracy. In some embodiments, as the training session continues, the cost function value initially improves (decreases) with each iteration until a point is reached at which the cost function value remains unchanged or increases from the previous iteration and the training/evaluation process is terminated. In some embodiments, the cost function is used in evaluating the neuron network's accuracy in applying the algorithm to a new data set (e.g., a test data set) as an indication that the previously trained neuron network is working effectively.

The parameters associated with a basic neuron network structure 702 are collectively represented by X and are specific to the particular configuration, i.e., the arrangement of the layers, nodes, and interconnections, of the associated neuron network. Data corresponding to these parameters are then used in operation 704 to initiate method 700 by providing, for example, the number of features (# features), the number of hidden layers and/or nodes (# hidden), and the number of outputs (# output). In operation 706, the neuron network data is used to build and initialize a neuron network. The neuron network is loaded with a series of initial parameters provided in operation 708. In operation 710, a training data set is prepared for execution by the neuron network.

In operation 712, the training data set is fed through the neuron network (FEED_FORWARD( )) to generate a cost value (GET_COST( )), also referred to as error, from which a gradient is calculated (GET_GRADIENT( )) and back propagated through the neuron network to update the weights and/or biases in order to reduce the cost/error in a series of iterations. Equations used in some embodiments for calculating adjustments to the weights and/or biases are collectively designated Y and are shown in box 724.

In some embodiments, once a sufficiently low or "optimized" cost/error value has been achieved using the training data set, a test data set is loaded in operation 714 and executed by the "trained" neuron network in a feed forward mode 722 to obtain corresponding output values. Results obtained by the neuron network using the test data set are then checked in operation 716. If the trained neuron network is not achieving a target level of error, the errors may be fed back to operation 712 through operation 718 whereby the neuron network can receive additional training for improving the accuracy of the results obtained by the neuron network.

Figure 8:
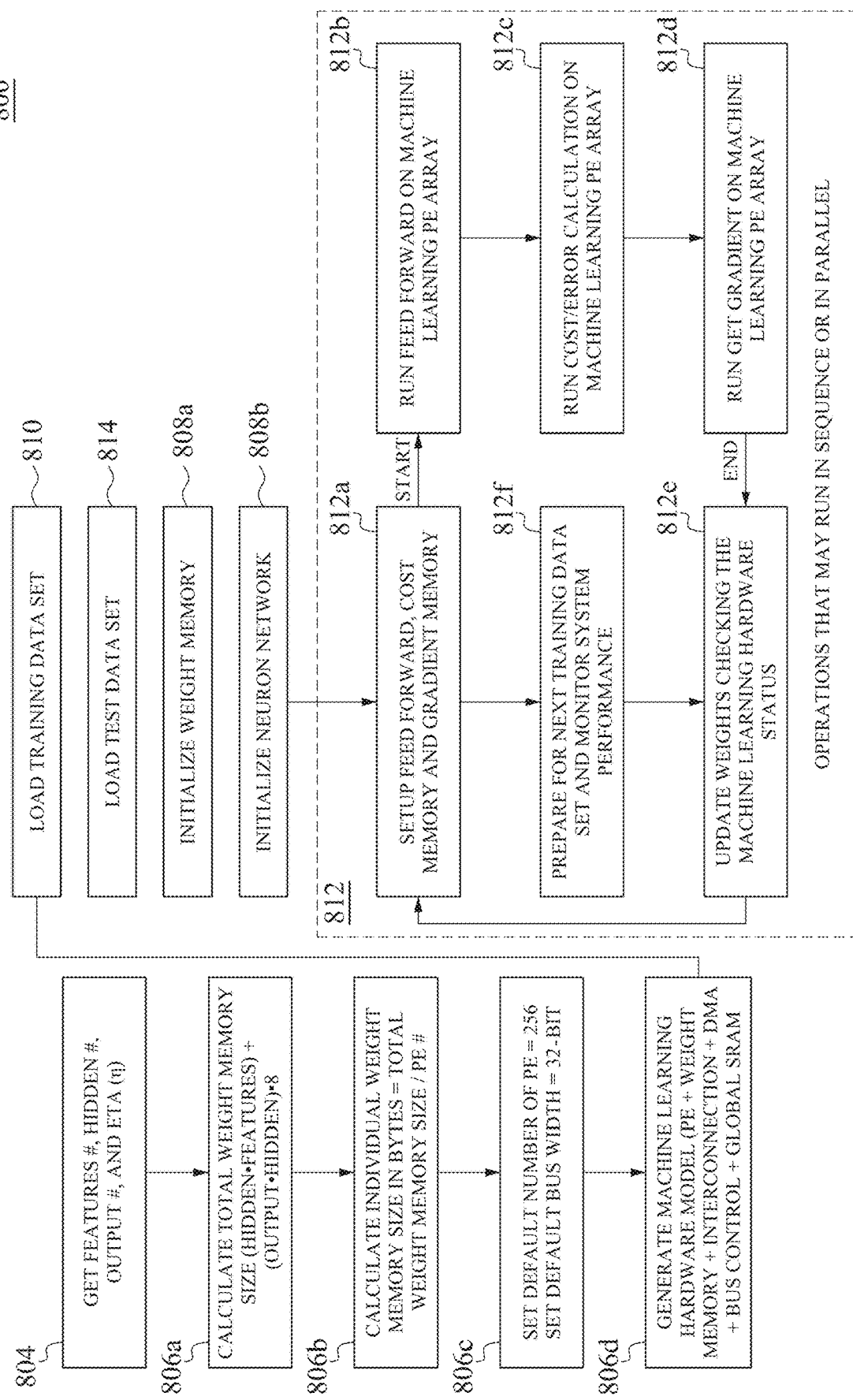
FIG. 8 is a flow chart reflecting the operation of a system and method 800 for developing an ESL model for machine learning applications in accordance with some embodiments.

FIG. 8 illustrates some embodiments of a method 800 by which a neuron network may be utilized in the machine learning application. In operation 804, a set of initial parameters is obtained including, for example, a number of features, the number of hidden nodes, the numbers of outputs, and a learning factor (or learning rate) n that will be used in calculating the weight adjustments. An additional calculation in operation 806a is used to determine the total weight memory size for a fully connected 3-layer neuron network by multiplying the number of hidden nodes by the number of input nodes (or features) and adding the number of output nodes multiplied by the number of hidden nodes and then multiplying the sum by the number of bits dedicated to each weight memory (in this case 8).

In operation 806*b*, the individual weight memory size and bytes is calculated by dividing the total weight memory size by the number of processing elements. In operation 806*c*, a default number of processing elements can be set, e.g., 256, and a default bus width can be set, e.g., 32-bit width. Based on these inputs and calculations, a machine learning hardware model is then generated in operation 806*d*.

After the machine learning hardware model has been generated, a training data set is loaded in operation 810, a test data set is loaded in operation 814, the weight memories associated with the nodes are initialized in operation 808*a*, and the data memories associated with the nodes are initialized in operation 808*b* to complete the initialization of the neuron network. With the neuron network initialized and the learning and test data sets loaded, the learning and evaluation operations can be conducted in operation 812. These operations include setting up the initial feedforward cost memory gradient memory values in operation 812*a*, running the feedforward operation on the machine learning processing element array in operation 812*b*, running the cost calculations on the machine learning processing element array in operation 812*c*, getting the gradient on the machine learning processing element array in operation 812*d*, updating the weights and checking the status of the machine learning hardware in operation 812*e*, and preparing for the next training data set and monitoring system performance in operation 812*f*. Depending on the capacity and configuration of machine learning hardware various operations, the various operations 812*a*-*f* encompassed within operation 812, may run sequentially or in parallel.

Figure 9:
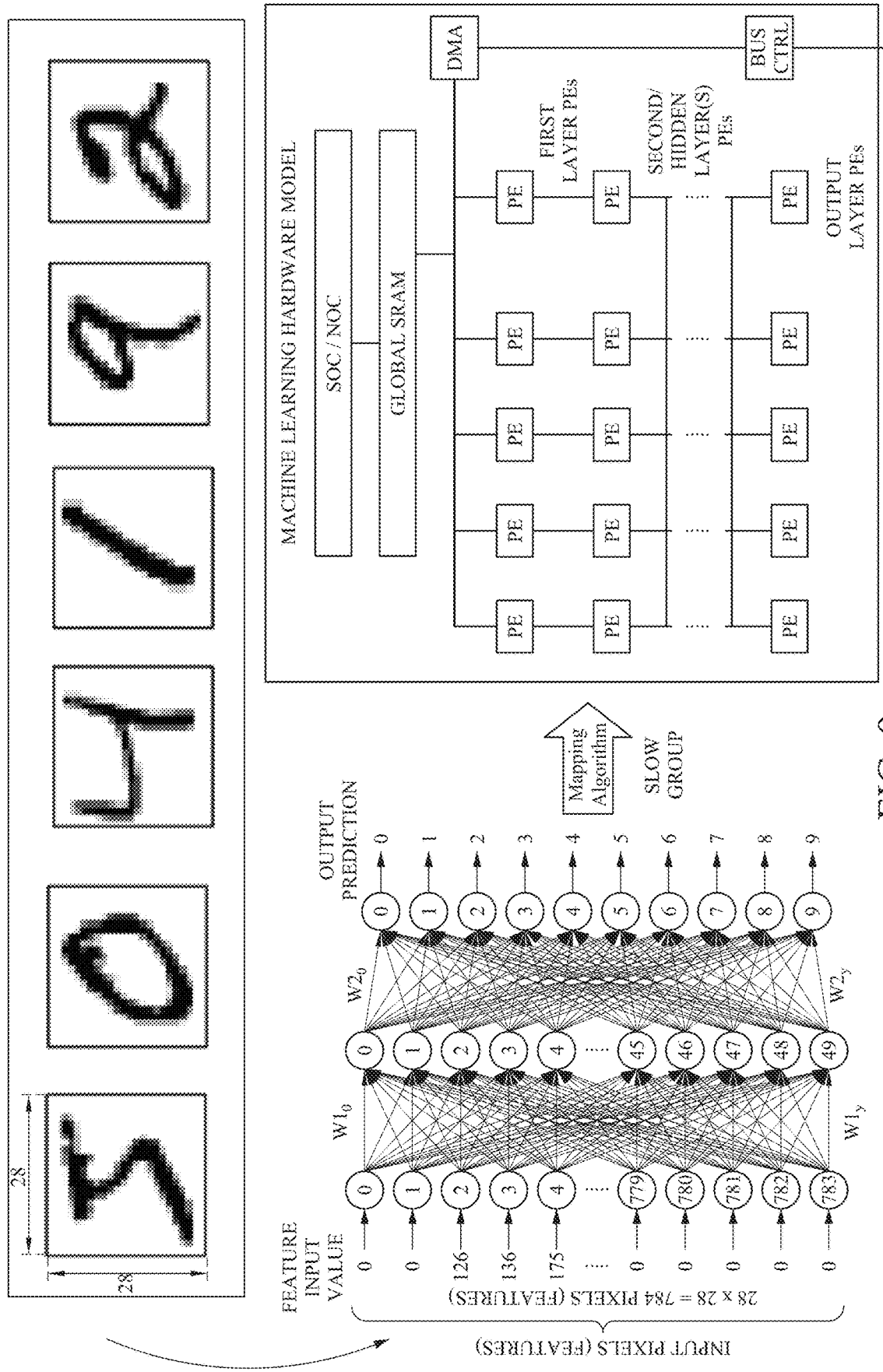
FIG. 9 is a chart reflecting the application of a system and method for developing a machine learning hardware model (MLHM) for an ESL model for machine learning in accordance with an embodiment configured for recognizing handwritten numerals.
Figure 10:
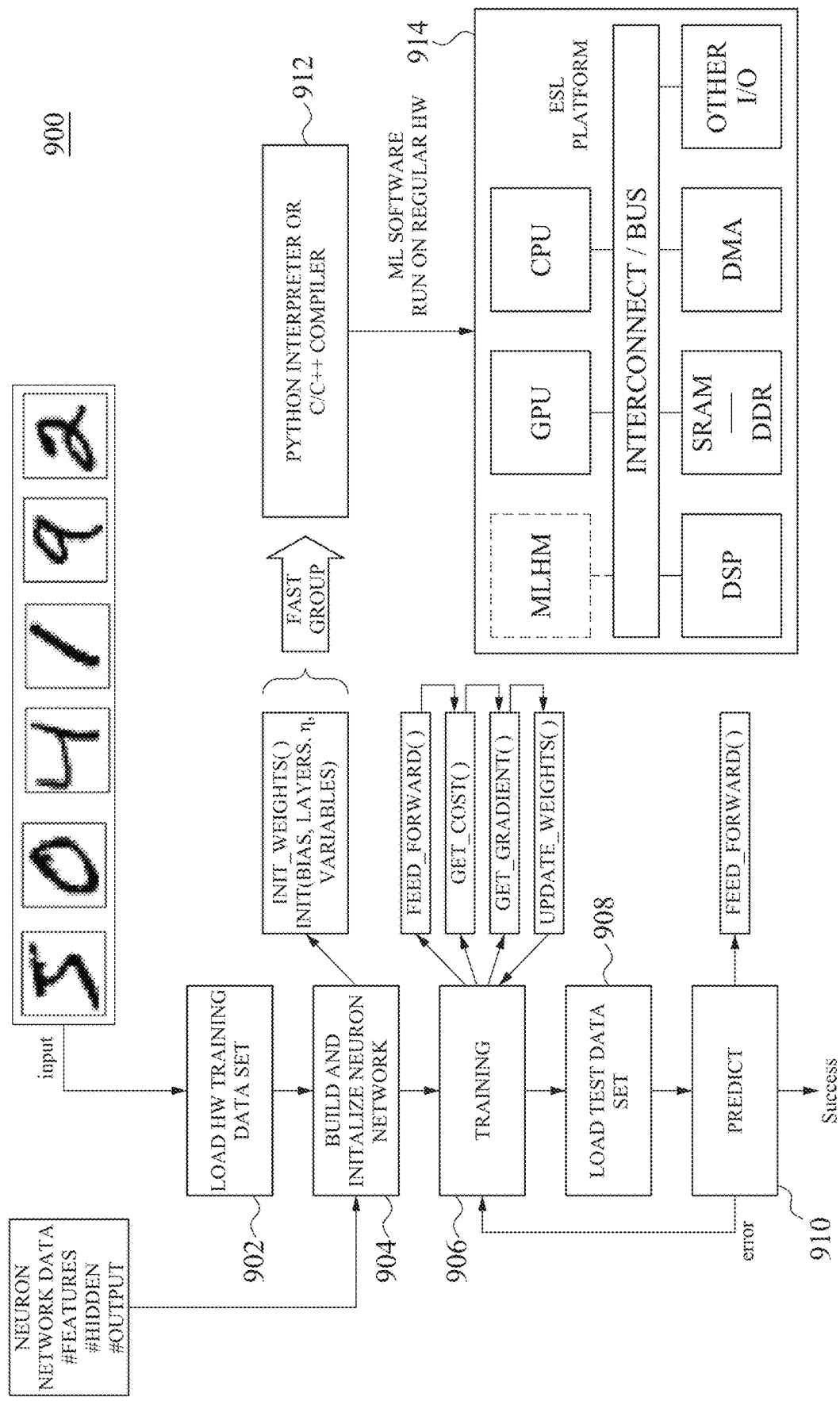
FIG. 10 is a chart reflecting the application of a system and method for developing a machine learning memory subsystem and machine learning software model for an ESL model for machine learning in accordance with an embodiment configured for recognizing handwritten numerals.

FIGS. 9 and 10 illustrate an example application of an embodiment of a machine learning and modeling system directed to the problem of classifying individual, handwritten digits. Although this example includes a 3-layer neural network, other configurations of similar or greater complexity would be expected to perform satisfactorily. In this example, as shown in FIG. 9, the handwritten digits are being scanned on a 28×28 pixel array for a total of 784 pixels. The neuron network is designed whereby each of the pixels is associated with a corresponding input node (or feature) numbered between 0 and 783, each of which is, in turn, connected to each of 50 nodes in the hidden layer numbered between 0 and 49. Each of the 50 hidden nodes is also connected to one of 10 output nodes, one for each possible digit.

Each of the connections between the input nodes and hidden nodes has a corresponding weight W10-W1y. Similarly, each of the connections between the hidden nodes and output nodes has a corresponding weight W20-W2z. An embodiment of the system receives information regarding the specific node configuration/designations and the various interconnections and maps the slow group operations onto an array of processing units (PEs) available in the machine learning hardware model by defining the connections between the PEs to configure the neuron network. The PE array may be fabricated or provided on, for example, an ASIC device in which the upper layer connectors are configured to provide the connectivity and functionality necessary for emulating that of the initial 3-layer NN design.

Each of input nodes is assigned a value, e.g., between 0 and 1, with 0 representing white, 1 representing black, and intermediate values corresponding to various shades of gray or, alternatively, in an 8-bit version, a value between 0 (white) and 255 (black) system with values 0-254 corresponding to different shades of gray. The assigned input value corresponds to the degree of "blackness" of that portion of the handwritten number under consideration found in the corresponding pixel of the 28×28 array.

After the neuron network has been defined, the neuron network needs to be trained using a training data set that includes a number of handwritten digits sufficient to expose the neuron network to a wide variation in the style and expression of each number. The accuracy of the neuron network in processing the test data set is evaluated using a function, alternatively referred to as a cost function, error function, loss function, or objective function, which sums the "costs" incurred when running the training set data through the neuron network with a particular configuration of weights and biases applied. The goal of the training is to find a set of weights and biases that will minimize the total cost, which will, in turn, improve the accuracy of the output.

FIG. 10 shows an embodiment of a process flow 900 including the operations of loading a handwriting training data set in operation 902, building and initializing a neuron network in operation 904. Operation 904 uses input regarding the design of the neuron network including the number of features, the number of hidden nodes, and the number of output nodes and outputs an initial configuration including the initial weights, initial biases, initial layers, a learning constant ($\eta$), and other variables.

The neuron network is then trained in operation 906 using the training data set. As detailed in connection with FIG. 7, the neuron network training in operation 906 includes a feedforward operation using the training data set, using the results of that feedforward operation to generate cost and gradient data and then backpropagating the cost/error data and adjusting the weights and biases accordingly using a learning factor. In some embodiments, the learning factor is fixed, in other embodiments, the learning factor may be reduced during a learning/training operation to reduce the time required to obtain a trained NN. In some embodiments, the learning factor may be reduced according to a pre-defined learning factor schedule over the course of a training operation. In some embodiments, the learning factor may be reduced over the course of a training operation according to an adaptive learning factor method including time-based decay, step decay, exponential decay or other available methods. This iterative process continues until the cost value reaches a minimum value or is below a predetermined target value at which point the training process is ended. At the end of training, the trained neuron network is tested in operation 908 using a test data set with the results of the test being evaluated in operation 910.

Unlike the functions/operations that were categorized as belonging to the slow group, those functions and operations that were categorized as belonging to the fast group are not converted to machine learning hardware. The fast group functions and operations are, instead converted in a conversion operation 912 to a combination of machine learning software and a conventional platform 914 configured for running the machine learning software. The conversion operation 912 may include the use of a Python, a C/C++ compiler, or another suitable tool.

Applications for machine learning systems include, for example, speech recognition, image recognition, handwriting analysis, security, visual processing, natural language processing, pharmaceutical research, medical imaging, medical diagnostics, bioinformatics, and image correction/restoration.

In some embodiments, a non-transitory computer-readable storage medium is encoded with a set of instructions for designing a semiconductor device using electronic system level (ESL) modeling for machine learning applications that, when executed by at least one processor, causes the at least one processor to: retrieve a source code operable to execute a plurality of operations of a machine learning algorithm; classify a first group of the plurality of operations as slow group operations and classify a second group of the plurality of operations as fast group operations, based on a time required to complete each operation; define a neural network operable to execute the slow group operations; define a trained neural network configuration including a plurality of interconnected neurons operable to execute the slow group operations; and generate an ESL platform for evaluating a design of a semiconductor device based on the trained neural network configuration.

In some embodiments, a system for designing a semiconductor device includes a profiling module, wherein: the profiling module is configured to retrieve a source code operable to execute a plurality of operations of a machine learning algorithm, and the profiling module is configured to classify a first group of the plurality of operations as slow group operations and classify a second group of the plurality of operations as fast group operations, based on a time required to complete each operation; and a design module, wherein: the design module is configured to define a neural network operable to execute the slow group operations; the design module is configured to define a trained neural network configuration including a plurality of interconnected neurons operable to execute the slow group operations, and the design module is configured to generate an ESL platform for evaluating a design of a semiconductor device based on the trained neural network configuration.

In some embodiments, a set of one or more non-transitory computer-readable storage media include processor-executable instructions embodied in the one or more non-transitory computer-readable storage media, wherein the instructions, when executed by at least one processor, cause the at least one processor to perform a process that includes: receiving first operations that are slow operations; defining a neural network for executing the first operations; mapping the neural network to a machine learning hardware configuration for executing the first operations; and modeling the machine learning hardware configuration as one or more semiconductor chips that are useable to execute the first operations, wherein: the first operations are a subset of a plurality of operations of a machine learning algorithm, the plurality of operations further including fast operations, the fast and slow operations being classified based on a time required to complete each operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-transitory computer-readable storage medium encoded with a set of instructions for designing a semiconductor device using electronic system level (ESL) modeling for machine learning applications that, when executed by at least one processor, causes the at least one processor to:
retrieve a source code operable to execute a plurality of operations of a machine learning algorithm;
classify a first group of the plurality of operations as slow group operations and classify a second group of the plurality of operations as fast group operations, based on a time required to complete each operation;
define a neural network operable to execute the slow group operations;
define a trained neural network configuration including a plurality of interconnected neurons operable to execute the slow group operations; and
generate an ESL platform for evaluating a design of a semiconductor device based on the trained neural network configuration.

2. The non-transitory computer-readable storage medium of claim 1, wherein the set of instructions causes the at least one processor to:
define a machine learning software model operable to model execution of the fast group operations in conjunction with the trained neural network configuration.

3. The non-transitory computer-readable storage medium of claim 1, wherein the set of instructions causes the at least one processor to:
define a memory subsystem and a hardware model such that one or more of the memory subsystem or the hardware model correspond to one or more of a graphics processing unit, a central processing unit, a digital signal processor, a random-access memory, a read only memory, a direct access memory, an IP block, or an interconnector.

4. The non-transitory computer-readable storage medium of claim 1, wherein the set of instructions causes the at least one processor to:
generate an application specific integrated circuit device design that includes a plurality of processing units corresponding to the trained neural network configuration.

5. The non-transitory computer-readable storage medium of claim 1, wherein the set of instructions causes the at least one processor to:
define a neural network to include:
a plurality of nodes; and
a plurality of interconnections between nodes of the plurality of nodes; and
assign an initial interconnection weight to each interconnection of the plurality of interconnections in a machine learning hardware configuration.

6. The non-transitory computer-readable storage medium of claim 5, wherein the set of instructions causes the at least one processor to:
assign each node of the plurality of nodes of the neural network to a corresponding processing element of an application specific integrated circuit device design.

7. The non-transitory computer-readable storage medium of claim 1, wherein the set of instructions causes the at least one processor to:
model a final machine learning hardware configuration operable to execute the slow group operations.

8. The non-transitory computer-readable storage medium of claim 7, wherein the set of instructions causes the processor to:
output a device design file corresponding to the final machine learning hardware configuration; and
generate a machine learning software code for executing the fast group operations.

9. A system for designing a semiconductor device, the system comprising:
- a profiling module, wherein:
  - the profiling module is configured to retrieve a source code operable to execute a plurality of operations of a machine learning algorithm, and
  - the profiling module is configured to classify a first group of the plurality of operations as slow group operations and classify a second group of the plurality of operations as fast group operations, based on a time required to complete each operation; and
- a design module, wherein:
  - the design module is configured to define a neural network operable to execute the slow group operations;
  - the design module is configured to define a trained neural network configuration including a plurality of interconnected neurons operable to execute the slow group operations, and
  - the design module is configured to generate an ESL platform for evaluating a design of a semiconductor device based on the trained neural network configuration.

10. The system of claim 9, wherein the design module is configured to generate a machine learning software model and a hardware model,
the system further comprising:
- a virtual test module configured to emulate the machine learning software model and the hardware model.

11. The system of claim 10, wherein the machine learning software model corresponds to the fast group operations.

12. The system of claim 9, wherein the design module is configured to output a device design file that embodies the trained neural network configuration.

13. The system of claim 12, further comprising:
- a fabrication module configured to fabricate a semiconductor device based on the device design file.

14. The system of claim 9, wherein the profiling module is configured to determine a percentage of an overall processing time of the machine learning algorithm consumed by each of the plurality of operations, and to set a fast group/slow group cutoff as a percentage of the overall processing time.

15. The system of claim 14, wherein the profiling module is configured to set the cutoff at about 15% of the overall processing time, the fast group operations being operations that collectively consume less processing time than the cutoff.

16. A set of one or more non-transitory computer-readable storage media, comprising:
- processor-executable instructions embodied in the one or more non-transitory computer-readable storage media, wherein the instructions, when executed by at least one processor, cause the at least one processor to perform a process that includes:
  - receiving first operations that are slow operations;
  - defining a neural network for executing the first operations;
  - mapping the neural network to a machine learning hardware configuration for executing the first operations; and
  - modeling the machine learning hardware configuration as one or more semiconductor chips that are useable to execute the first operations, wherein:
  - the first operations are a subset of a plurality of operations of a machine learning algorithm, the plurality of operations further including fast operations, the fast and slow operations being classified based on a time required to complete each operation.

17. The set of one or more non-transitory computer-readable storage media of claim 16, wherein the process includes:
- determining a percentage of an overall processing time of the machine learning algorithm consumed by each of the plurality of operations, and
- setting a fast operation/slow operation cutoff as a percentage of the overall processing time.

18. The set of one or more non-transitory computer-readable storage media of claim 16, wherein the process includes:
- generating a machine learning software model and a hardware model; and
- performing emulation of the machine learning software model and the hardware model.

19. The set of one or more non-transitory computer-readable storage media of claim 18, wherein the process includes:
- generating the machine learning software model to model the fast operations.

20. The set of one or more non-transitory computer-readable storage media of claim 18, wherein the process includes:
- outputting a device design file corresponding to the hardware model.

* * * * *